United States Patent
Dawson et al.

(10) Patent No.: US 8,957,727 B2
(45) Date of Patent: Feb. 17, 2015

(54) ASYMMETRIC MULTILEVEL OUTPHASING ARCHITECTURE FOR RF AMPLIFIERS

(71) Applicants: Joel L. Dawson, Roslindale, MA (US); David J. Perreault, Brookline, MA (US); SungWon Chung, Cambridge, MA (US); Philip Godoy, Hercules, CA (US); Everest Huang, Cambridge, MA (US)

(72) Inventors: Joel L. Dawson, Roslindale, MA (US); David J. Perreault, Brookline, MA (US); SungWon Chung, Cambridge, MA (US); Philip Godoy, Hercules, CA (US); Everest Huang, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/798,738

(22) Filed: Mar. 13, 2013

(65) Prior Publication Data

US 2014/0125412 A1 May 8, 2014

Related U.S. Application Data

(63) Continuation of application No. 13/423,909, filed on Mar. 19, 2012, now Pat. No. 8,659,353, which is a continuation of application No. 13/106,195, filed on May 12, 2011, now Pat. No. 8,164,384, which is a (Continued)

(51) Int. Cl.
*H03F 3/217* (2006.01)
*H03F 1/02* (2006.01)
*H03F 3/60* (2006.01)

(52) U.S. Cl.
CPC .............. *H03F 3/217* (2013.01); *H03F 1/0244* (2013.01); *H03F 1/0277* (2013.01); *H03F 1/0294* (2013.01); *H03F 3/602* (2013.01); *H03F 3/2176* (2013.01)
USPC ...................................... 330/124 R

(58) Field of Classification Search
CPC ....... H03F 3/72; H03F 1/0277; H03F 1/0088; H03F 1/305; H03F 2200/294; H03F 3/602; H03F 1/0288; H03F 3/211; H03F 3/24; H03F 2200/451; H03F 3/604
USPC ............................... 330/51, 124 R, 295, 297
See application file for complete search history.

(56) References Cited

U.S. PATENT DOCUMENTS

| | | | |
|---|---|---|---|
| 3,818,360 | A | 6/1974 | Boutmy et al. |
| 5,892,395 | A | 4/1999 | Stengel et al. |

(Continued)

FOREIGN PATENT DOCUMENTS

| | | |
|---|---|---|
| EP | 170 366 A2 | 2/2007 |
| EP | 170 366 A3 | 2/2007 |

(Continued)

OTHER PUBLICATIONS

Notice of Allowance for U.S. Appl. No. 13/423,909 dated Nov. 22, 2013.

(Continued)

*Primary Examiner* — Khanh V Nguyen
(74) *Attorney, Agent, or Firm* — Daly, Crowley, Molford & Durkee, LLP

(57) ABSTRACT

A radio frequency (RF) circuit includes a power supply configured to generate a plurality of voltages, a plurality of power amplifiers, each having an RF output port and a power supply input port, a switch network having a plurality of input ports coupled to the power supply and a plurality of switch network output ports coupled to the power supply input ports of the plurality of power amplifiers, wherein the switch network is configured to output selected ones of the plurality of voltages from the plurality of switch network output ports, at least two of the switch network output port voltages capable of being different ones of the plurality of voltages, and an RF power combiner circuit having a plurality of input ports coupled to RF output ports of the plurality of power amplifiers and an output port at which is provided an output signal of the RF circuit.

33 Claims, 12 Drawing Sheets

Related U.S. Application Data continuation of application No. 12/615,696, filed on Nov. 10, 2009, now Pat. No. 8,026,763.

(60) Provisional application No. 61/113,556, filed on Nov. 11, 2008.

(56) References Cited

U.S. PATENT DOCUMENTS

| | | | |
|---|---|---|---|
| 6,133,788 | A | 10/2000 | Dent |
| 6,140,807 | A | 10/2000 | Vannatta et al. |
| 6,157,253 | A * | 12/2000 | Sigmon et al. ............... 330/10 |
| 6,255,906 | B1 * | 7/2001 | Eidson et al. ............ 330/124 R |
| 6,327,462 | B1 | 12/2001 | Loke et al. |
| 6,377,117 | B2 * | 4/2002 | Oskowsky et al. ............. 330/51 |
| 6,396,341 | B1 | 5/2002 | Pehlke |
| 6,738,432 | B2 * | 5/2004 | Pehlke et al. ............ 330/124 R |
| 7,091,778 | B2 * | 8/2006 | Gan et al. ..................... 330/136 |
| 7,103,114 | B1 | 9/2006 | Lapierre |
| 7,236,542 | B2 | 6/2007 | Matero |
| 7,330,070 | B2 | 2/2008 | Vaisanen |
| 7,362,251 | B2 | 4/2008 | Jensen et al. |
| 7,535,133 | B2 | 5/2009 | Perreault et al. |
| 7,589,605 | B2 | 9/2009 | Perreault et al. |
| 7,705,681 | B2 | 4/2010 | Ilkov |
| 7,889,519 | B2 | 2/2011 | Perreault et al. |
| 7,956,572 | B2 | 6/2011 | Zane et al. |
| 8,026,763 | B2 | 9/2011 | Dawson et al. |
| 8,164,384 | B2 | 4/2012 | Dawson et al. |
| 8,212,541 | B2 | 7/2012 | Perreault et al. |
| 8,451,053 | B2 * | 5/2013 | Perreault et al. ......... 330/124 R |
| 2007/0066224 | A1 | 3/2007 | d'Hont et al. |
| 2007/0066250 | A1 | 3/2007 | Takahashi et al. |
| 2007/0069818 | A1 | 3/2007 | Bhatti et al. |
| 2007/0123184 | A1 | 5/2007 | Nesimoglu et al. |
| 2007/0146090 | A1 | 6/2007 | Carey et al. |
| 2007/0159257 | A1 | 7/2007 | Lee et al. |
| 2007/0247222 | A1 | 10/2007 | Sorrells et al. |
| 2007/0247253 | A1 | 10/2007 | Carey et al. |
| 2007/0281635 | A1 | 12/2007 | McCallister et al. |
| 2007/0290747 | A1 | 12/2007 | Traylor et al. |
| 2007/0291718 | A1 | 12/2007 | Chan et al. |
| 2008/0001660 | A1 | 1/2008 | Rasmussen |
| 2008/0003960 | A1 | 1/2008 | Zolfaghari |
| 2008/0003962 | A1 | 1/2008 | Ngai |
| 2008/0007333 | A1 | 1/2008 | Lee et al. |
| 2008/0012637 | A1 | 1/2008 | Aridas et al. |
| 2008/0019459 | A1 | 1/2008 | Chen et al. |
| 2010/0073084 | A1 * | 3/2010 | Hur et al. ................. 330/124 R |
| 2010/0120384 | A1 | 5/2010 | Pennec |
| 2010/0201441 | A1 | 8/2010 | Gustavsson |
| 2011/0148518 | A1 | 6/2011 | Lejon et al. |
| 2012/0176195 | A1 | 7/2012 | Dawson et al. |
| 2012/0313602 | A1 | 12/2012 | Perreault et al. |
| 2012/0326684 | A1 | 12/2012 | Perreault et al. |
| 2013/0241625 | A1 | 9/2013 | Perreault et al. |
| 2013/0343106 | A1 | 12/2013 | Perreault et al. |
| 2013/0343107 | A1 | 12/2013 | Perreault |
| 2014/0118063 | A1 | 5/2014 | Briffa et al. |
| 2014/0118065 | A1 | 5/2014 | Briffa et al. |
| 2014/0118072 | A1 | 5/2014 | Briffa et al. |
| 2014/0120854 | A1 | 5/2014 | Briffa et al. |
| 2014/0125412 | A1 | 5/2014 | Dawson et al. |
| 2014/0132354 | A1 | 5/2014 | Briffa et al. |
| 2014/0226378 | A1 | 8/2014 | Perreault |

FOREIGN PATENT DOCUMENTS

| | | |
|---|---|---|
| WO | WO 2005/106613 A1 | 11/2005 |
| WO | WO 2006/119362 A2 | 11/2006 |
| WO | WO 2007/082090 A2 | 7/2007 |
| WO | WO 2007/094921 A1 | 8/2007 |
| WO | WO 2007/136919 A2 | 11/2007 |
| WO | WO 2007/136919 A3 | 11/2007 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

Office Action dated Apr. 25, 2013 from U.S. Appl. No. 13/423,909.

Response to Office Action dated Apr. 26, 2013 from U.S. Appl. No. 13/423,909.

Office Action dated May 22, 2013 from U.S. Appl. No. 13/423,909.

Response to Office Action dated Sep. 12, 2013 from U.S. Appl. No. 13/423,909.

Xuejun Zhang, et al., "Analysis of Power Recycling Techniques for RF and Microwave Outphasing Power Amplifiers", IEEE Transactions on Circuits and Systems-II: Analog and Digital Signal Porcessing, vol. 49, No. 5, May 2002, pp. 312-320.

Sungwon Chung et al., "Asymmetric Multilevel Outphasing Architecture for Multi-Standard Transmitters", 2009 IEEE Radio Frequency Integrated Circuits Symposium, pp. 237-240.

D. Diaz, et al., "Comparison of Two Different Cell Topologies for a Multilevel Power Supply to Achieve High Efficiency Envelope Amplifier", IEEE , 2009, pp. 25-30.

M. Rodriguez, et al., "Multilevel Converter for Envelope Tracking in RF Power Amplifiers", IEEE, 2009, pp. 503-510.

Yuan-Jyue Chen, et al., "Multilevel LINC System Design for Wireless Transmitters", IEEE, 2007, pp. 1-4.

Jinsung Choi, et al., "A Δ Σ —Digitized Polar RF Transmitter", IEEE Transcations on Microwave Theory and Techniques, vol. 55, No. 12, Dec. 2007, pp. 2679-2690.

Kai-Yuan Jheng, et al., "Multilevel LINC System Design for Power Efficiency Enhancement", IEEE, 2007, pp. 31-34.

Kevin Tom, et al., "Load-Pull Analysis of Outphasing Class-E Power Amplifier", The $2^{nd}$ International Conference on Wireless Broadband and Ultra Wideband Communications (AusWireless 2007), IEEE, 2007, pp. 1-4.

Yehui Han, et al., "Resistance Compression Networks for Radio-Frequency Power Comversion", IEEE Transcations on Power Electronics, vol. 22, No. 1, Jan. 2007, pp. 41-53.

Surya Musunuri, et al., "Improvement of Light-Load Efficiency Using Width-Switching Scheme for CMOS Transistors", IEEE Power Electronics Letters, vol. 3, No. 3, Sep. 2005, pp. 105-110.

Frederick H. Raab, et al., "RF and Microwave Power Amplifier and Transmitter Technologies—Part 3", Sep. 2003, High Frequency Electronics, Summit Technical Media, LLC., pp. 34-48.

Petri Eloranta, et al., "A Multimode Transmitter in 0.13 μm CMOS Using Direct-Digital RF Modulator", IEEE Journal of Solid-State Circuits, vol. 42, No. 12, Dec. 2007, pp. 2774-2784.

Hur, et al., "Highly Efficient and Linear Level Shifting Digital LINC Transmitter with a Phase Offset Cancellation;" IEEE; Jul. 2009; pp. 211-214.

Hur, et al., "A Multi-Level and Multi-Band Class-D CMOS Power Amplifier for the LINC System in the Cognitive Radio Application;" IEEE; Feb. 2010, pp. 1-3.

Hur, et al., "Highly Efficient Uneven Multi-Level LINC Transmitter;" Electronics Letter; vol. 45, No. 16; Jul. 30, 2009; 2 pages unnumbered.

Invitation to Pay Additional Fees in PCT/US2009/063821 dated Feb. 9, 2010.

PCT Search Report of the ISA dated Apr. 13, 2010.

PCT Written Opinion of the ISA dated Apr. 13, 2010.

International Preliminary Report on Patentability of the ISA for PCT/US2009/063821 dated May 26, 2011.

(56) References Cited

OTHER PUBLICATIONS

Amendment to Office Action mailed Apr. 7, 2011 (U.S. Appl. No. 12/680,048, filed Mar. 25, 2010).
Image File Wrapper downloaded on Mar. 13, 2013 for U.S. Appl. No. 12/615,696, filed Nov. 10, 2009; 427 pages.
Image File Wrapper downloaded on Mar. 12, 2013 for U.S. Appl. No. 13/106,195, filed May 12, 2011; Part 1 or 2, 295 pages.
Image File Wrapper downloaded on Mar. 12, 2013 for U.S. Appl. No. 13/106,195, filed May 12, 2011; Part 2 of 2, 234 pages.
Image File Wrapper downloaded on Mar. 12, 2013 for U.S. Appl. No. 13/423,909, filed Mar. 19, 2012 Part 1 of 3, 353 pages.
Image File Wrapper downloaded on Mar. 12, 2013 for U.S. Appl. No. 13/423,909, filed Mar. 19, 2012 Part 2 of 3, 370 pages.
Image File Wrapper downloaded on Mar. 12, 2013 for U.S. Appl. No. 13/423,909, filed Mar. 19, 2012 Part 3 of 3, 368 pages.
Notice of Allowance for Application No. 13/423,909, filed Mar. 19, 2012.
U.S. Appl. No. 14/035,445, filed Sep. 24, 2013, Perreault.
U.S. Appl. No. 14/338,671, filed Jul. 23, 2014, Briffa et al.

\* cited by examiner

ASYMMETRIC MULTILEVEL OUTPHASING ARCHITECTURE FOR RF AMPLIFIERS

CROSS-REFERENCE TO RELATED APPLICATIONS

This application is a continuation of co-pending application Ser. No. 13/423,909 filed on Mar. 19, 2012 which is a continuation of application Ser. No. 13/106,195 filed on May 12, 2011 which claims the benefit of co-pending application Ser. No. 12/615,696 filed on Nov. 10, 2009 which claims priority under 35 U.S.C. §119(e) from U.S. Provisional Patent Application No. 61/113,556, filed Nov. 11, 2008, which applications are hereby incorporated herein by reference in their entireties for all purposes.

STATEMENT REGARDING FEDERALLY SPONSORED RESEARCH

This invention was made with government support under contract number FA8721-05-C-0002 awarded by the Department of the Air Force. The government has certain rights in this invention.

FIELD OF THE INVENTION

This invention relates to radio frequency (RF) circuits and more particularly to RF amplifier circuits.

BACKGROUND

As is known in the art, RF transmitter design is centered on a design tradeoff between the linearity of the power amplifier and its efficiency. This tradeoff relates directly to the usefulness of the resulting device. High linearity results in a higher possible data rate and therefore compatibility with complex standards such as Wireless Local Area Network (WLAN) and Worldwide Interoperability for Microwave Access (WiMAX), and high efficiency allows for reduced cooling, energy usage and power supply requirements (e.g., in stationary applications), and longer use or smaller battery size (e.g., in cell phone and portable applications). The general perception that the tradeoff between linearity and efficiency is fundamental tends to produce designs that compromise between these two design goals. The resulting systems may be either linear or efficient, or are designed specifically for a single communications standard and therefore have limited flexibility of use. Meanwhile, consumer demand for both greater transmission rates and smaller devices continues to drive the need for an architecture that is capable of both linearity and efficiency.

As is also known in the art, communications standards that support high data rates such as WLAN/WiMAX employ variable-envelope modulation, and so linear amplification is required. One conventional approach is to use an inefficient but highly linear power amplifier. However, there are two main types of transmitter architectures that enable the use of more efficient but non-linear switching mode power amplifiers: (1) polar, and (2) outphasing, or linear amplification of nonlinear components (LINC).

Conventional polar architectures divide a signal to be amplified into amplitude and phase components. The phase component is used as the input to a non-linear, high-efficiency switching power amplifier, while the amplitude component drives the power supply of the power amplifier to create a varying-envelope signal. While this improves the power amplifier efficiency, it also requires the use of an efficient wide-output range, high-bandwidth power converter. Because converter efficiency degrades dramatically as bandwidth increases, it is very difficult to achieve high efficiency for high data-rate communication standards. This is exacerbated by the 5-10× bandwidth expansion that occurs during the conversion from Cartesian to polar coordinates. Thus, this conventional approach is only practical for low-bandwidth systems.

Outphasing, and specifically conventional LINC architectures, is based on the fact that an arbitrary input signal that can be divided into two constant-amplitude, phase-modulated signals that can each be non-linearly amplified and then passively recombined as a vector sum. This vector sum produces an output signal that is a linearly amplified version of the input. The LINC strategy eliminates the high-bandwidth power converter of the polar architecture, using outphasing to realize amplitude variation. However, the efficiency of the power combining is high only over a small range of output powers. To avoid signal distortion and preserve amplifier efficiency, an isolating combiner is often used. Conventional isolating combiners achieve 100% efficiency only at maximum output power. When the inputs are outphased to vary the amplitude, power is wasted as heat in the isolation resistor. The result is an overall efficiency that is inversely proportional to the peak-to-peak average power ratio (PAPR), limiting the benefits of this conventional approach in high data-rate communication standards such as WiMAX, in which the PAPR is high.

One of the major drawbacks of the LINC architecture is the power wasted in the power combiner. However, a combiner must be used to isolate outphased power amplifiers and provide a fixed impedance load to the power amplifiers in order to avoid signal distortion and preserve switching amplifier efficiency. But power is wasted as heat in the combiner resistor when the inputs are outphased to vary the amplitude. Since the power delivered to the combiner by power amplifiers is constant, the efficiency of the LINC system is directly proportional to the output power sent to a load. The time-averaged efficiency is therefore inversely proportional to the peak-to-average power ratio (PAPR). Unfortunately, high-level modulation schemes such as 64-QAM and OFDM tend to have high PAPR, leading to low average efficiency when the LINC system is used.

To alleviate the problem of wasted energy during outphasing, sometimes non-isolating combiners are used. The Chireix combiner is a prominent example which uses compensating reactive elements to enhance the power-combining efficiency. However, the Chireix combiner can only be tuned for a very small range of outphase angles. With outphase angles outside the tuned range, the load impedance presented to the power amplifiers deviates too far from the nominal value and the isolation between the power amplifier outputs becomes poor. The result is significant distortion and degraded amplification efficiency.

One proposed power recycling technique described in Zhang X., at al. "Analysis of power recycling techniques for RF and microwave outphasing power amplifiers," IEEE Trans. Circuit Syst. II, vol. 49, no. 5, May 2002, pp. 312-320, attempts to enhance the power efficiency of the LINC architecture without giving up the simplicity of an isolating combiner. The isolation resistor is replaced with an RF-dc converter to recover the wasted power back to the power supply. While this approach has been shown to result in a significant increase in the overall efficiency, it suffers from excessive impedance variation at the isolation port and therefore incomplete isolation between power amplifiers. This can lead to excessive signal distortion and lower efficiency or even complete breakdown in the power amplifiers, particularly in those sensitive to load impedance, such as many switched-mode power amplifiers. An additional isolator can be added between the isolation port and the RF-dc converter to reduce this effect, but at the cost of added complexity and loss.

SUMMARY

In general overview, the circuits, concepts, and techniques described herein provide an asymmetric multilevel outphasing (AMO) transmitter architecture which includes a switch network capable of supplying discrete voltages to power amplifiers. The power amplifiers are power combined to provide an output signal over a wide power range. An AMO modulation technique is used to minimize amplifier outphasing angles to achieve higher efficiency and linearity in a transmission architecture. The result is a highly efficiency architecture that is compatible with a wide range of communication standards and applications. For example, the inventive concepts, circuits, and techniques described herein may be used to provide highly efficient military and/or commercial transmitters for use in handheld units, laptop wireless modems, and base stations. The inventive concepts, circuits and techniques may also be used to provide high-efficiency RF power amplification for medical applications (such as RF amplifiers for Magnetic Resonance Imaging) and industrial and commercial applications (such as plasma generation, heating, coating, and sintering), In one aspect, a radio frequency (RF) circuit includes a power supply configured to generate a plurality of voltages, a plurality of power amplifiers, each having an RF output port and a power supply input port, a switch network having a plurality of input ports coupled to the power supply and a plurality of switch network output ports coupled to the power supply input ports of the plurality of power amplifiers, wherein the switch network is configured to output selected ones of the plurality of voltages from the plurality of switch network output ports, at least two of the switch network output port voltages capable of being different ones of the plurality of voltages, and an RF power combiner circuit having a plurality of input ports coupled to RF output ports of the plurality of power amplifiers and an output port at which is provided an output signal of the RF circuit.

In further embodiments, the RF circuit includes one or more of the following features: each of the power amplifiers has an RF input port configured to receive a phase-adjusted signal and the switch network is configured to receive a plurality of control signals, wherein the phase-adjusted signals and the switch network control signals are used to control the output signal of the RF circuit; a control system configured to provide the phase-adjusted signals over a plurality of first output ports coupled to the RF input ports of the plurality of power amplifiers and the plurality of control signals over a plurality of second output ports coupled to the switch network; the control system is further configured to decrease a difference between a total of the power output from the plurality of power amplifiers and a power output from the RF circuit; the RF power combiner circuit includes an isolating combiner; the power combiner circuit further includes a resistance compression network and a rectification circuit coupled to the resistance compression network; a plurality of LC filters configured to couple the switch network to respective ones of the plurality of power amplifiers, and; at least one of the power amplifiers is width-switched.

In another aspect, the concepts, circuits, and techniques described herein are directed to an outphasing energy recovery amplifier (OPERA) architecture that substantially reduces the impedance variation at an isolation port of a combiner through the use of a resistance compression network (RCN). The RCN improves the matching and isolation between outphased amplifiers, helping to maintain high linearity as well as high efficiency in switching-mode amplifiers.

The OPERA architecture includes circuitry to recover power that would otherwise be wasted in an isolation resistor back to a power supply. In some embodiments, the isolation resistor is replaced with an RF-dc converter. The equivalent input impedance of the rectifier varies with input power which can reduce the isolation between the power amplifiers and can lower power amplification efficiency (and in some instances, cause complete malfunction) and increase unwanted signal distortion at the output. To mitigate these unwanted effects, a RCN is included to reduce the rectifier impedance variation. In some embodiments, an impedance transformation stage is placed between the RCN and the power combiner's isolation port to match the resistance-compressed rectifier impedance to the impedance required by the power combiner.

In another aspect, a radio frequency (RF) circuit includes a plurality of power amplifiers, each having an RF output port, and an RF power combiner circuit having a plurality of input ports coupled to respective ones of the RF output ports of the plurality of power amplifiers, and including a resistance compression network, a rectification circuit coupled to the resistance compression network, and an output port at which is provided an output signal of the RF circuit.

In further embodiments, the RF circuit includes one or more of the following features: the RF power combiner circuit provides isolation between the plurality of RF power combiner circuit input ports; each of the power amplifiers has a power supply input port and further including a power supply providing voltages at a plurality of power supply output ports, wherein at least two of the power supply output ports provide different voltages, and a switching circuit to selectively couple each power amplifier power supply input port to at least one of the power supply output ports, and; each of the power amplifiers has an RF input port configured to receive a phase adjusted signal and the switching circuit is configured to receive at least one control signal, wherein the phase adjusted signals and the at least one switching circuit control signal are used to control the output signal of the RF circuit.

In a further aspect, a radio frequency (RF) transmission method includes providing a plurality of voltages, outputting selected ones of the plurality of voltages to a plurality of power amplifiers, at least two of the outputted voltages capable of being different ones of the plurality of voltages, and providing an RF power combiner circuit having a plurality of input ports coupled to the plurality of power amplifiers, and an output port at which is provided an output signal of the RF circuit.

In further embodiments, the method includes one or more of the following features: providing a power supply to generate the plurality of voltages, providing the plurality of voltages to a plurality of input ports of a switch network, and in the switch network, providing the selected ones of the plurality of voltages to RF input ports of the plurality of power amplifiers; each of the power amplifiers has an RF input port, further including controlling the output signal of the RF circuit by adjusting the phases of the signals received at the RF input ports and dynamically selecting the ones of the plurality of voltages outputted to each of the power amplifiers; decreasing a difference between a sum of the powers outputted by the power amplifiers and an RF power outputted at the output port of the RF circuit; said decreasing includes minimizing the difference between the sum of the powers outputted by the power amplifiers and the RF power outputted at the output port of the RF circuit; gating on a variable number of transistors in at least one of the power amplifiers; providing isolation between the plurality of input ports, and; processing at least a portion of the RF power output from the power amplifiers using at least one resistance compression network and at least one rectification circuit coupled to the at least one resistance compression network, wherein the processed RF power includes recovered RF power from the RF power combiner circuit.

BRIEF DESCRIPTION OF THE DRAWINGS

The foregoing features of concepts, circuits, and techniques described herein may be more fully understood from the following description of the drawings in which.

DETAILED DESCRIPTION

Figure 1:
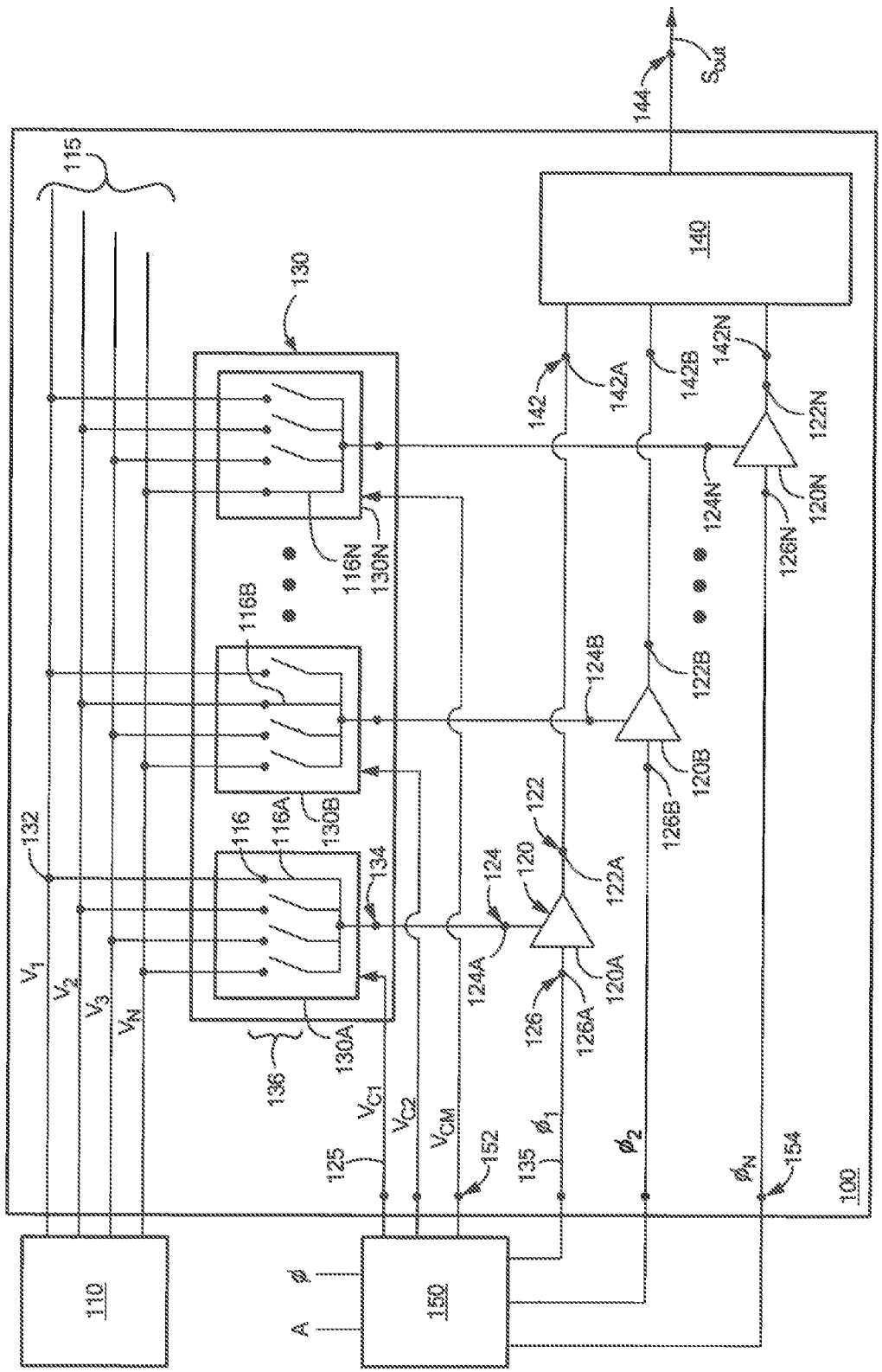
FIG. 1 is a block diagram of an embodiment of an asymmetric multilevel outphasing (AMO) circuit.

Referring now to FIG. 1, in one aspect a radio frequency (RF) circuit 100 includes a power supply 110 configured to generate a plurality of voltages $V_1, V_2, V_3-V_N$ (generally designated by reference numeral 115), a plurality of power amplifiers 120A, 120B-120N (generally designated by reference numeral 120), each having an RF output port 122A, 122B-122N (generally designated by reference numeral 122) and a power supply input port 124A, 124B-124N (generally designated by reference numeral 124). The RF circuit 100 includes a switch network 130 having a plurality of input ports (generally designated by reference numeral 132) coupled to the power supply 110 and a plurality of switch network output ports (generally designated by reference numeral 134) coupled to the power supply input ports 124 of the plurality of power amplifiers 120.

In the RF circuit embodiment of FIG. 1, switch network 130 includes switch circuits 130A, 130B-130N each of which is coupled to respective power amplifiers 120A, 120B-120N. Each of the switch circuits 130A, 130B-130N includes a number of switches (generally designated by reference numeral 136) selectively coupled to respective input voltages $V_1, V_2, V_3-V_N$ to output selected ones of the voltages 115. For example, each of the switch circuits 130A, 130B-130N includes four switches 136 to select one of the four input voltages $V_1, V_2, V_3-V_N$. It should be noted that although four input voltages (and four respective switches) are shown, one of ordinary skill in the art will readily appreciate that any number of input voltages may be used, for example, two, three, five, ten, 100, 1000, etc., and switch network 130 may be provided including an appropriate number of switch network input ports and switch network output ports.

The switch network 130 (which in some embodiments may be referred to as a switching circuit) is configured to output selected ones 116A, 116B-116N (generally designated by reference numeral 116) of the plurality of voltages 115 at the plurality of switch network output ports 134. At least two (i.e., two, three, five, ten, 100, 1000, etc.) of the switch network output port voltages 134 are capable of being different ones of the plurality of voltages 115. As by way of a non-limiting example shown in the RF circuit embodiment of FIG. 1, three of the selected voltages 116A, 116B, and 116N are different voltages, namely respective input voltages $V_1, V_2$, and $V_N$.

It should be noted that the selected voltages 116 need not be different. For example, a single voltage (e.g., $V_1$) may be selected for output at the switch network output ports 134. In other words, even though the switch network 130 is capable of outputting different ones of the input voltages 115, the same input voltage may be selected for output at the switch network output ports 134.

The RF circuit 100 further includes an RF power combiner circuit 140 having a plurality of input ports 142A, 142B-142N (generally designated by reference numeral 142) coupled to RF output ports 122 of the plurality of power amplifiers 120, and an output port 144 at which is provided an output signal $S_{out}$ of the RF circuit 100. In a further embodiment, the RF power combiner 140 is an isolating combiner.

In another embodiment, the RF circuit 100 includes a plurality of low-pass filters coupled between the switch network 130 and the power amplifiers 120. The low-pass filters can provide pulse shaping to reduce or in some cases minimize and/or even eliminate undesirable high frequency content that may be introduced into a signal primarily caused by rapid changes in the switched supply voltages 115. In some embodiments, these low-pass filters are nominally low-order LC filters with low loss, but there are many different ways that a low-pass filter can be implemented. For example, another possibility is that the parasitic capacitances and inductances, always present in any physical circuit, provide enough filtering that an explicit low-pass filter is not required. A further possibility is that the energy storage of the RF power amplifiers 120 themselves (such as owing to the use of RF input chokes or inductors) may provide enough filtering that an explicit low-pass filter is not required.

In one or more embodiments, the RF circuit 100 may be referred to as an asymmetric multilevel outphasing (AMO) architecture for multi-standard transmitters. The AMO architecture can be generalized to include two or more power amplifiers, as may be similar to power amplifiers 120 described in conjunction with FIG. 1. When combined, such two or more power amplifiers are herein referred to as an "M-way" power amplifiers. An output of M-way power amplifiers may be described as a vector sum of M different power amplifier outputs, each of which can have two or more different supply voltages, as may be similar to input voltages 115 described in conjunction with FIG. 1. Such two or more supply voltages, when combined, are herein referred to as "N-way" supply voltages. Furthermore, each of the M power amplifiers may have an arbitrary phase.

In further embodiments, the RF circuit 100 includes a control system 150 further described herein below.

It will be appreciated by one of ordinary skill in the art that the RF circuit 100 is not limited to switch circuits 130A, 130B-130N for selecting input voltages 115. As by way of non-limiting examples, a multiplexor circuit may be used to select the input voltages 115 for output to the power amplifiers 120.

Figure 1B:
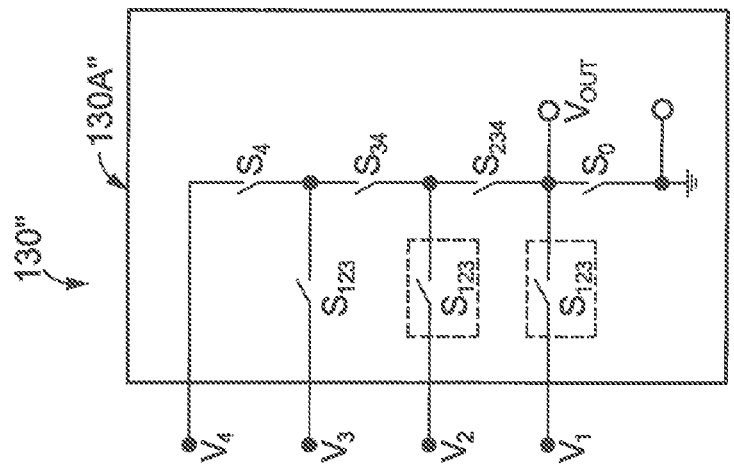
FIG. 1B is a circuit diagram of another embodiment of a switch network as may be used in the AMO circuit of FIG. 1.
Figure 1A:
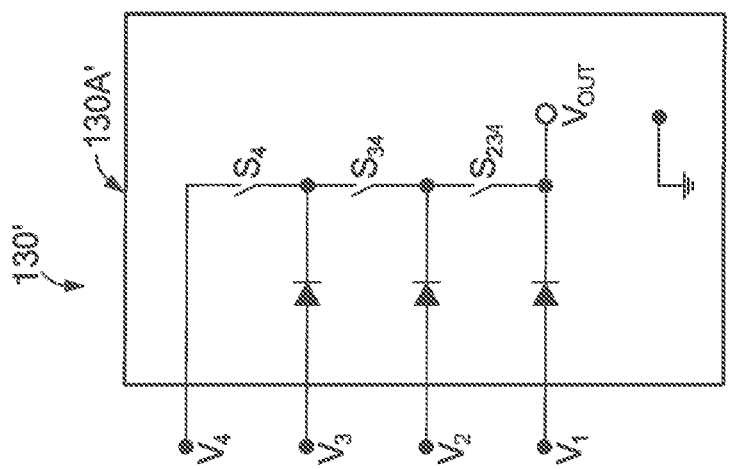
FIG. 1A is a circuit diagram of an embodiment of a switch network as may be used in the AMO circuit of FIG. 1.

Referring now to FIG. 1A, a further embodiment of a switch network 130' includes one or more switch circuits 130A', each of which is coupled one of the power amplifiers 120 (shown in FIG. 1).

Referring now to FIG. 1B, another embodiment of a switch network 130" includes one or more switch circuits 130A", each of which is coupled to one of the power amplifiers 120. It will be understood by one of ordinary skill in the art that some embodiments of a switch network may include combinations of switch circuits (e.g., combinations of switch circuits 130A, 130A', and/or 130A").

Figure 1C:
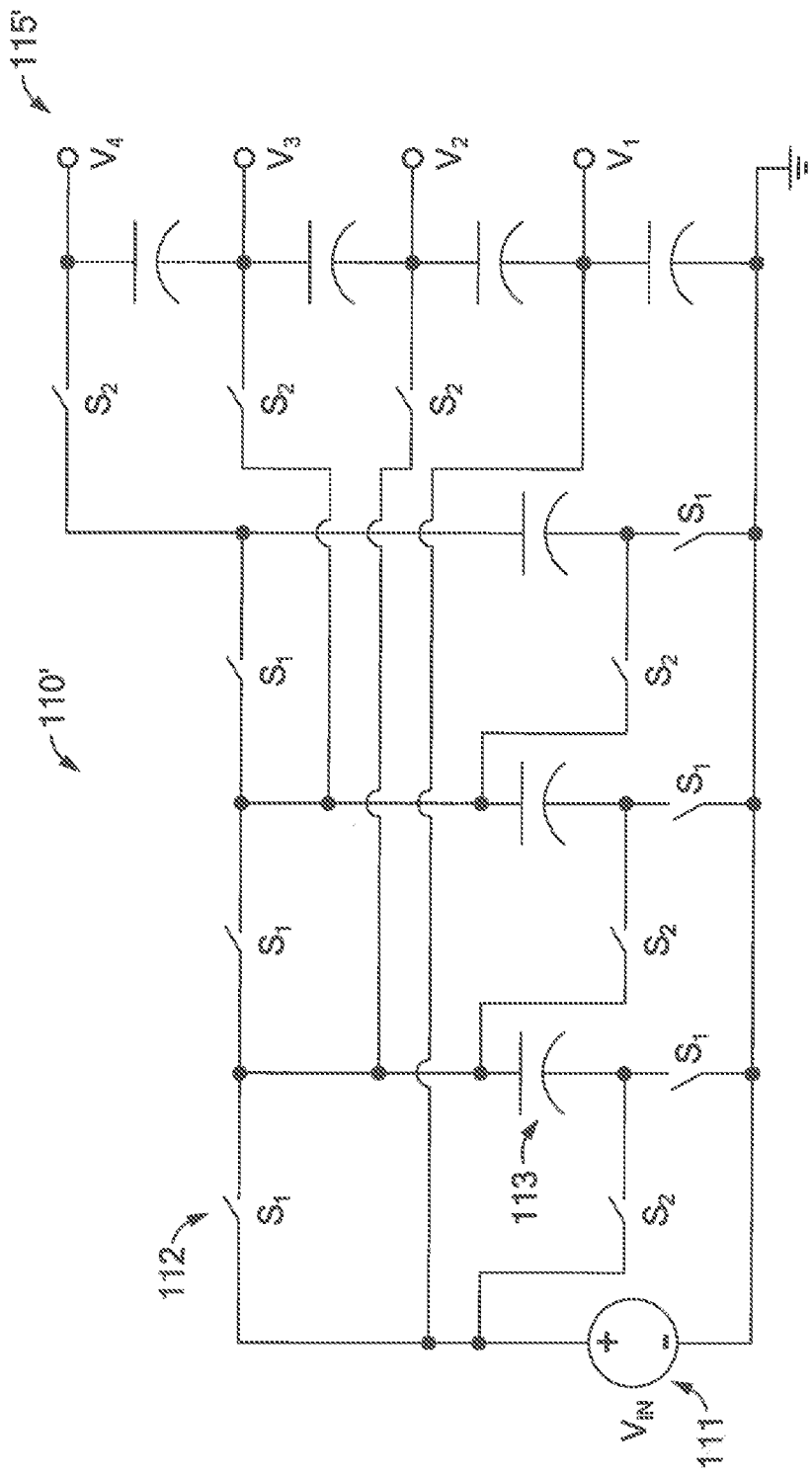
FIG. 1C is an exemplary embodiment of a power supply as may be used for supplying voltages to the AMO circuit of FIG. 1.

Referring again to FIG. 1, it should be noted that power supply 110 is not limited to any particular type of power supply and includes most any power supply capable of generating the plurality of voltages 115. Referring now to FIG. 1C, a non-limiting example of a switched-capacitor power supply 110' is shown including a voltage supply 111, switches (an example of which is designated by reference numeral 112, and switched capacitors (an example of which is designated by reference numeral 113) to provide voltages 115'. It should be noted that although four voltages are shown, the power supply 110' may generate any number of needed and/or desired voltages.

Figure 2:
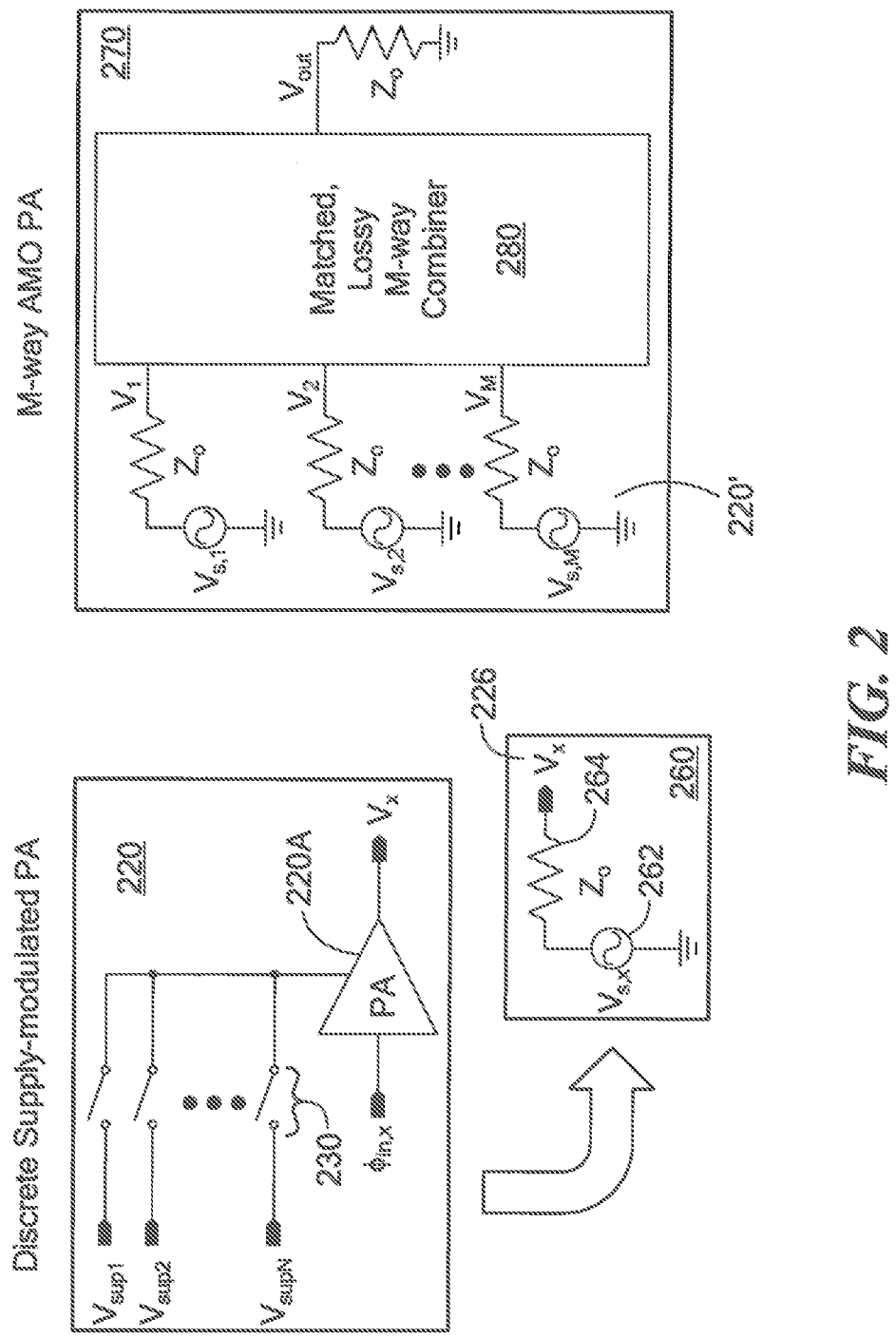
FIG. 2 is a schematic circuit diagram of an M-way power amplifier/N-way voltage level AMO circuit embodiment.

Referring now to FIG. 2, a schematic circuit diagram of a discrete supply-modulated power amplifier circuit 220 includes a power amplifier 220A coupled through switches 230 to voltage supplies $V_{sup1}, V_{sup2}-V_{supN}$. The power amplifier 220A receives an arbitrary phase signal $\phi_{in,x}$.

The discrete supply-modulated power amplifier circuit 220 may be represented as an equivalent circuit layout 260, which includes a voltage supply 262, resistor 264, and output voltage $V_x$ 266. A schematic of an M-way AMO power amplifier circuit 270 includes M circuit layouts 260 (an example of which is designated by reference numeral 220') coupled in parallel to a matched, lossy, M-way combiner 280 providing output voltage $V_{out}$.

Figure 3:
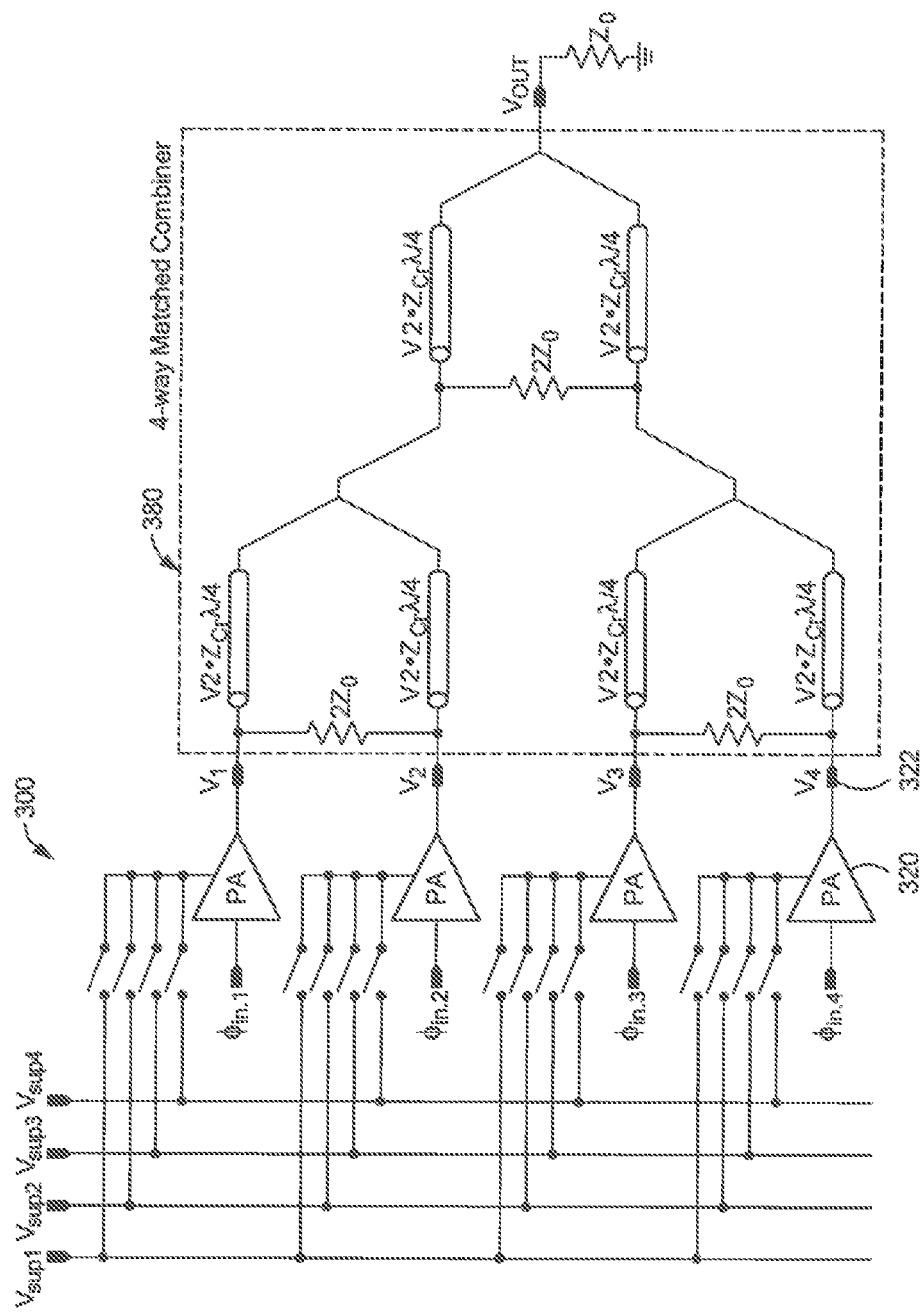
FIG. 3 is a block diagram of 4-way power amplifier/4-way voltage level AMO circuit embodiment including a 4-way matched combiner.

Referring now to FIG. 3, an example of an M-way, N-way circuit 300 is shown in which M=4 and N=4. A 4-way matched combiner 380 combines outputs 322 of each of the power amplifiers 320. The 4-way matched combiner 380 is realized as a corporate array (or binary tree) of 2-way Wilkinson combiners.

It will be appreciated by one of ordinary skill in the art that other types of combiners may be used. As by way of non-limiting examples, a combiner may include a binary or "corporate tree" of 2-way combiners, an M-way Wilkinson combiner, and/or a M-way inter-phase transformer with isolation resistors.

An M-way AMO circuit of the type described herein can be advantageous at high frequencies and power levels. For example, using two or more outphased power amplifiers in an AMO circuit can increase the number of efficiency peaks in power output performance for a given number of supply voltage levels. The efficiency for a given supply voltage combination using a matched isolating M-way combiner can be calculated as follows:

$$\eta = \frac{P_{out}}{\sum_{k=1}^{M} P_k}$$

$$= \frac{|V_{out}|^2}{\sum_{k=1}^{M} |V_k|^2}$$

Here, $P_k$ is the output power of the $k^{th}$ power amplifier, $V_k$ is the output voltage of the $k^{th}$ power amplifier, $P_{out}$ is the output power, and $V_{out}$ is the output voltage. This assumes 100% efficient power amplifiers and no combiner insertion loss. Note that if a symmetric dissipative isolating combiner is used, 100% efficiency can only be obtained when all the voltages being combined have the same amplitude. Therefore, there will be exactly N points of 100% efficiency in power output performance. When the voltages being combined have different amplitudes, there is loss in the combiner's isolation resistors.

Figure 4:
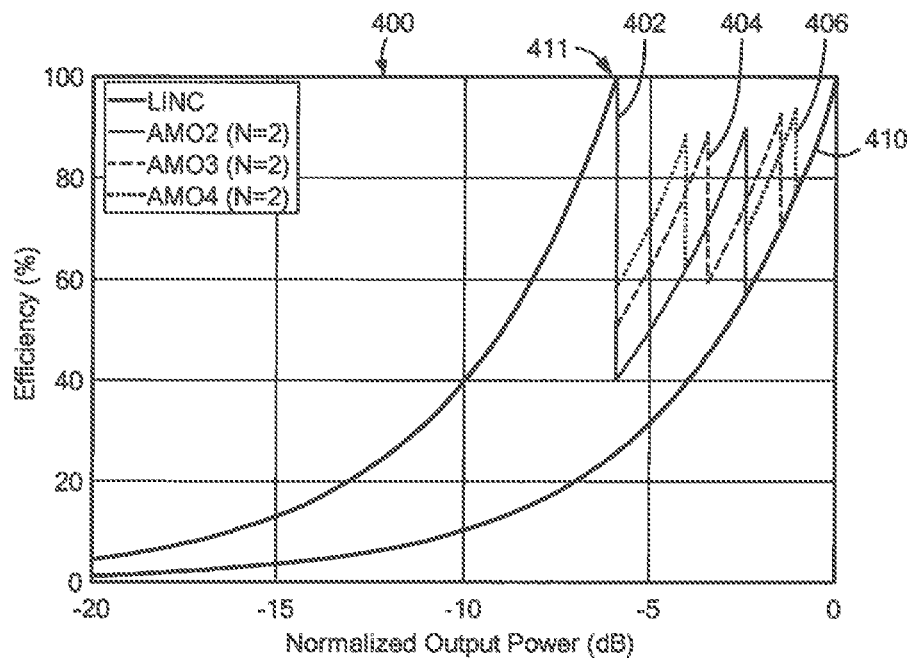
FIG. 4 is a graph showing power efficiency curves of AMO circuit embodiments having 2-way voltage levels.

Referring now to FIG. 4, a graph 400 has a horizontal axis denoting normalized output power in units of decibels (dB) and a vertical axis in percentage of power efficiency. In graph 400, theoretical power efficiency curves 402, 404, 406 are shown for respective M-way AMO circuits in which M=2, 3, 4, respectively, and in which N=2 voltage supply levels. A theoretical power efficiency curve 410 is also shown for a conventional linear amplification using non-linear components (LINC) circuit. The power efficiency curve for a given value of M (i.e., M=2, M=3, etc.) may be generated by first computing the efficiency vs. output power for each possible voltage combination, setting the efficiency to 0 if a given output power is unachievable for a given voltage combination, and taking the maximum efficiency over the different possible voltage combinations. Supply voltages have been selected such that two 100% efficiency points are separated by 6 dB. As can be readily seen in FIG. 4, a number of power efficiency peaks (an example of which is denoted by reference numeral 411) increases as M increases.

Figure 5:
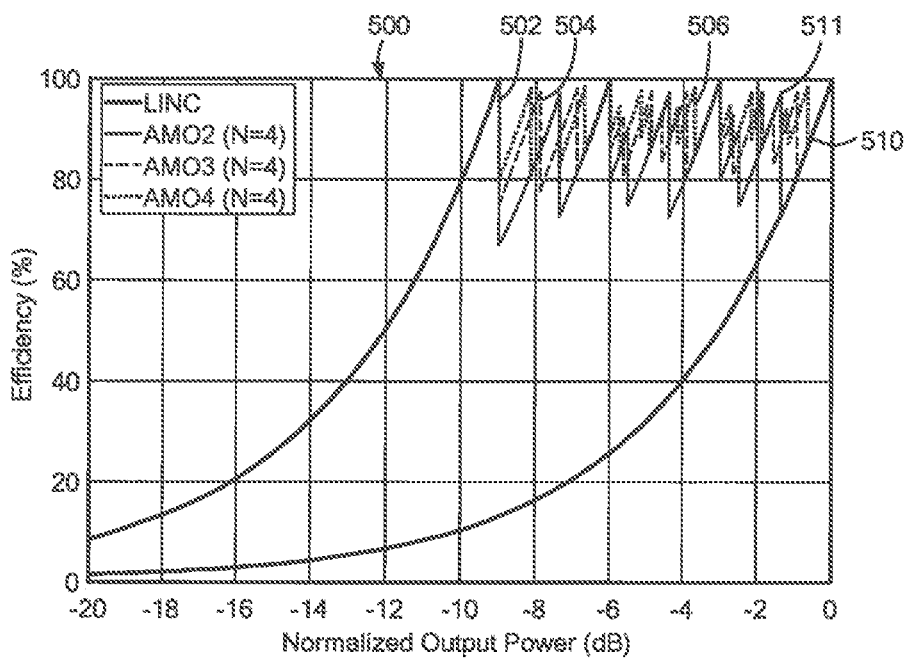
FIG. 5 is another graph showing power efficiency curves of further AMO circuit embodiments having 4-way voltage levels.

Referring now to FIG. 5, a graph 500 has a horizontal axis denoting normalized output power in arbitrary units of decibels (dB) and a vertical axis in percentage of power efficiency. In graph 500, theoretical efficiency curves 502, 504, 506 are shown for respective M-way AMO circuits in which M=2, 3, 4 and in which N=4 voltage supply levels. Also shown is a theoretical power efficiency curve 510 for a conventional LINC circuit. Supply voltages have been selected such that four 100% efficiency points are separated by 3 dB. As can be readily seen in FIG. 5, a number of power efficiency peaks (an example of which is denoted by reference numeral 511) increases as M increases.

For a given output voltage vector $V_{out} = A \cdot \exp(j \cdot \theta)$ and a given combination of power amplifier supply voltages, the phases for each of the power amplifiers can be computed as described herein below.

An output voltage may be defined as a vector sum of the M voltage vectors from each power amplifier as follows:

$$\vec{V}_{out} = \vec{V}_1 + \vec{V}_2 + \ldots + \vec{V}_M = A \angle \theta$$

The output voltage vector can be separated into real and imaginary components as follows:

$$Re(\vec{V}_{out}) = |V_1|\cos\phi_1 + |V_2|\cos\phi_2 + \ldots + |V_M|\cos\phi_M = A\cos\theta$$

$$Im(\vec{V}_{out}) = |V_1|\sin\phi_1 + |V_2|\sin\phi_2 + \ldots + |V_M|\sin\phi_M = A\sin\theta$$

These two equations yield M unknowns, which are the phases of the M power amplifiers. There are multiple possible solutions for M phases and, in some cases, no solution exists for a given amplitude A and a given set of voltage levels $V_k$. For purposes of illustration, the outphasing angles and voltage supply levels are calculated in such way as to minimize energy loss. Described here is method for the case of M=2. However, it should be understood that the method can be generalized to handle cases for which M>2.

In order to achieve an output vector with amplitude A, let the output amplitude of one power amplifier be $A_1$ chosen from a discrete set of possible values $V_k$, and that of the other be $A_2$, also chosen from the same set of discrete possible values. For each possible value of $A_1$ and $A_2$, the efficiency of the power combining operation can be calculated using the formula:

$$\eta_c = \frac{A^2}{A_1^2 + A_2^2}$$

All combinations of $A_1$ and $A_2$ for which this formula evaluates to a value exceeding 1 are impossible choices for realizing the output amplitude A. The values of $A_1$ and $A_2$ for which t is maximized (without exceeding 1) are the most efficient choices. That is, they result in the minimum outphasing angle and the minimum amount of wasted energy. Once the values $A_1$ and $A_2$ are chosen, the proper phases for the two power amplifiers are given by the following equations:

$$\varphi_1(t) = \theta(t) + \cos^{-1}\frac{(V_1(t)^2 + 2A(t)^2 - V_2(t)^2)}{2\sqrt{2}\,V_1(t)A(t)}$$

$$\varphi_2(t) = \theta(t) - \cos^{-1}\frac{(V_2(t)^2 + 2A(t)^2 - V_1(t)^2)}{2\sqrt{2}\,V_2(t)A(t)}.$$

In an AMO power amplifier circuit, as may be similar to RF circuit embodiment 100 described in conjunction with FIG. 1, output power and circuit conduction current levels change with the supply voltages delivered to the power amplifiers. The circuit conduction losses and switching losses decrease because the power supply input is switched to consecutively lower voltages as power is reduced. Gate drive power, however, does not experience similar reductions with output power, which can negatively impact efficiency at low output power levels.

Figure 6:
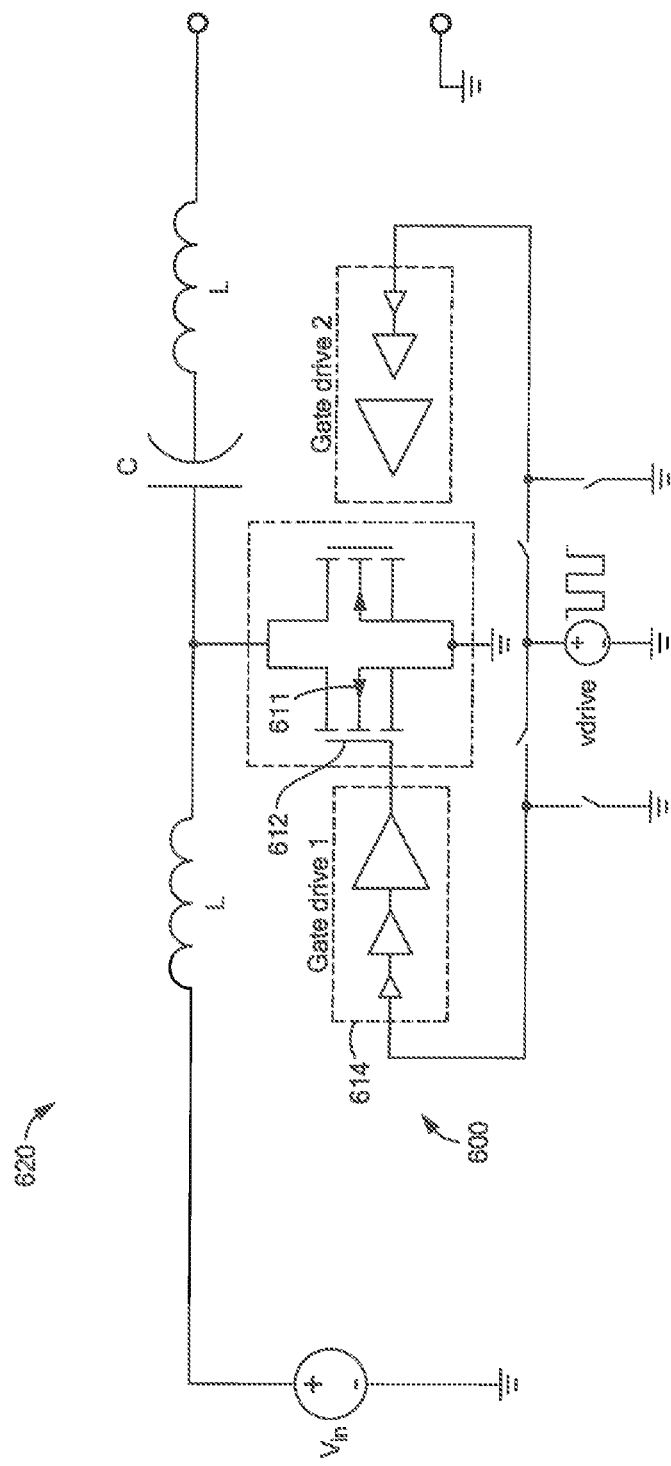
FIG. 6 is a circuit diagram of a width-switched power amplifier embodiment.

Referring now to FIG. 6, in some embodiments, an AMO power amplifier circuit includes a width-switching device 600 in a switching power amplifier 620, such as a class E switching amplifier. Such a device can parallel the output (drain-source) ports of multiple transistors 611 and drive transistor gates 612 with separately controlled gate drives 614. At low power levels, some of the gate drives 614 can be disabled (or otherwise driven to leave transistors 611 off) to save gating power. In such a way, gate drive loss reduction may be traded off for increase in on-state conduction, which can allow optimization of the number of transistor elements gated as a function of power level. More particularly, a number and relative size of width-switching devices 600 can be provided and driven separately at an input source (and operated in parallel at transistor outputs) so as to provide good efficiency over a desired power range.

In an exemplary operation of width-switching device 600, when $V_{in}$ is relatively large (for example, selected as a large input voltage for high power output), a first gate drive (i.e. gate drive 1) and a second gate drive (i.e., gate drive 2) provide AC gate-drive switching signals to transistors 611. Alternatively, when $V_{in}$ is relatively small (for example, selected as a small input voltage for lower power output) one of the gate drive switching signals is modified to hold the gate drive output low to deactivate one of the transistors while another one of transistor is gated on and off.

In a further embodiment, first and second gate drives provide substantially similar gating patterns.

In another embodiment, at least one of the gate drives is a plurality of coupled amplifiers.

In a further embodiment, more than two width-switching devices could be sized equally in a geometric sizing arrangement (e.g., widths A, 2A, 4A, etc.) or other sizing strategy. In still further embodiments, devices are matched to realize an optimum lowest loss for different power amplifier input voltages of the AMO circuit. This can enable high efficiency at each power supply level in the AMO circuit.

Referring again to FIG. 1, in a further RF circuit embodiment each of the power amplifiers 120A, 120B-120N has an RF input port 126A, 126B-126N (generally designated by reference numeral 126) configured to receive respective phase-adjusted signals $\phi_1$, $\phi_2$-$\phi_N$ (generally denoted by reference numeral 135). Furthermore, the switch network 130 is configured to receive a plurality of control signals $V_{C1}$, $V_{C2}$-$V_{CN}$ (generally designated by reference numerals 125). As will be described herein below, the phase-adjusted signals 135 and control signals 125 control the output signal 144 of the RF circuit.

In still a further embodiment, a control system 150, which receives as input an amplitude A and a phase φ, is configured to provide the phase-adjusted signals 135 over a plurality of first output ports 154 coupled the RF input ports 126 of the power amplifiers 120 and the control signals 125 over a plurality of second output ports 152 coupled to the switch network 130.

Figure 7A:
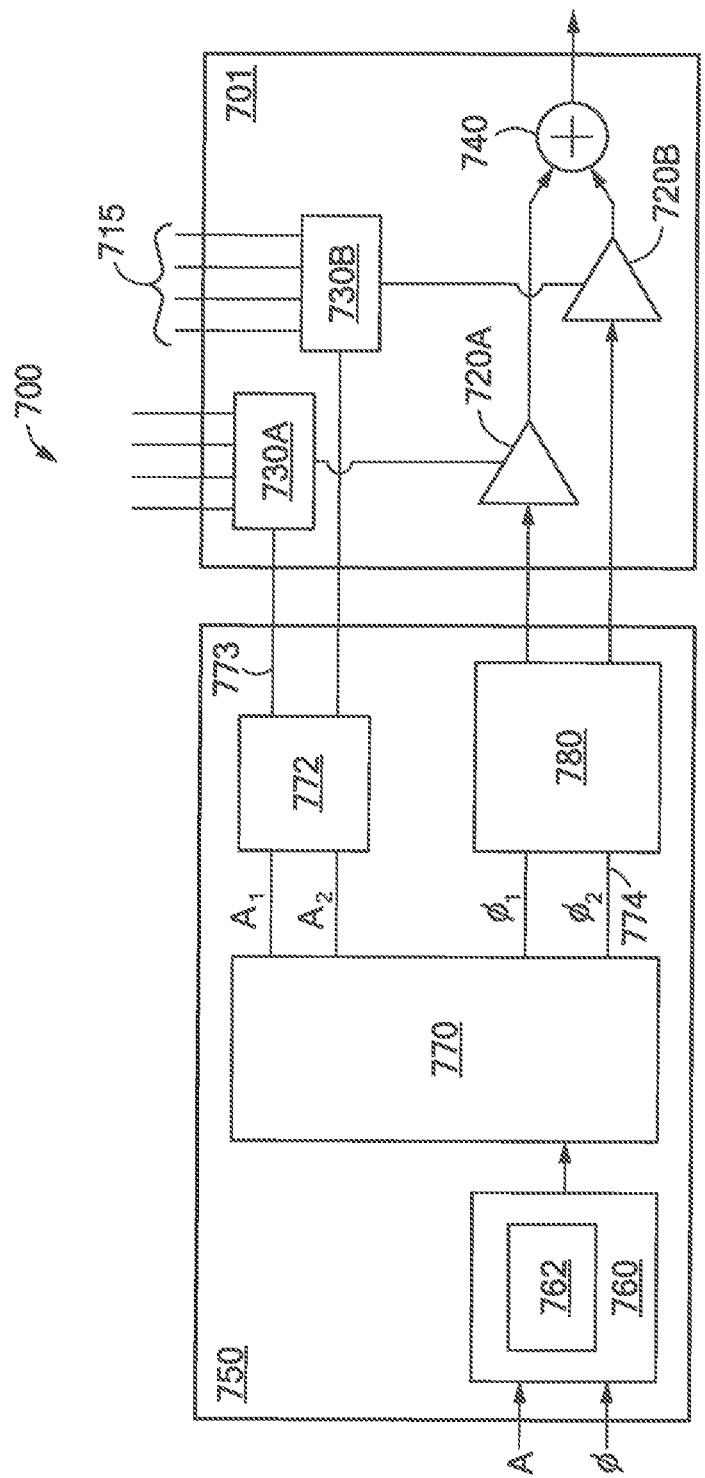
FIG. 7A is a block diagram of a two power amplifier/four voltage level circuit embodiment including a control system.

Referring now to FIG. 7A, in a further embodiment an AMO circuit 700 includes a control system 750 and an RF circuit 701. The control system 750 includes a predistorter 760, an AMO modulator 770, and a digital radio frequency power converter (DRFPC) 780 for modulating a baseband signal comprising amplitude A and phase φ components. The RF circuit 701, which may be a further embodiment of the RF circuit embodiment 100 described in conjunction with FIG. 1, includes a first switch 730A and a second switch 730B for selecting voltage levels 715 supplied to respective first power amplifier 720A and second power amplifier 720B. The voltage levels 715 are received from a power supply (not shown) as may be similar to power supply 110 described in conjunction with FIG. 1. In a further embodiment, the AMO modulator 770 drives a fast switching network and switching mode amplifiers, which may include, but are not limited to, class-E, class-F, class-φ, and/or class E/F power amplifiers. An RF power combiner 740 combines the outputs of first and second power amplifiers 720A, 720B, while providing isolation between its input ports.

The predistorter 760 linearizes the combined non-linearity from the DRFPC 780, switches 730A, 730B, and power amplifiers 720A, 720B. A polar lookup table 762 is used to store lookup values for amplitude A and phase φ components as will be described herein below. The AMO modulator 770 determines a combination of two power voltages 715 supplied to the power amplifiers 720A, 720B based on a peak amplitude within a time interval, which in a further control system embodiment is determined in a interval peak detector. The AMO modulator 770 decomposes a predistorted amplitude and phase received from the predistorter 760 into a pair of amplitude values ($A_1$, $A_2$) and a pair of phase values ($\phi_1$, $\phi_2$) using a first-order approximation of equations 3A and 3B described herein below. In a further embodiment, the AMO modulator includes a time aligner 772 to maintain any time delay mismatch between amplitude paths 773 and phase paths 774 to within the margin required by a particular application.

The DRFPC 780 performs phase modulation by embedding phase components $\phi_1$, $\phi_2$ of the AMO modulator output into an RF carrier signal. The DRFPC 780 includes an array of current steering switches and can bring a significant transmitter power efficiency boost particularly for low output power levels for two reasons. First, the analog matching requirement in the current steering switches is relaxed because the static phase errors in the DRFPC output, which result from analog mismatch, can be corrected by the predistorter 760. Second, the DRFPC 780 does not need baseband active filters for DAC output shaping.

Figure 7B:
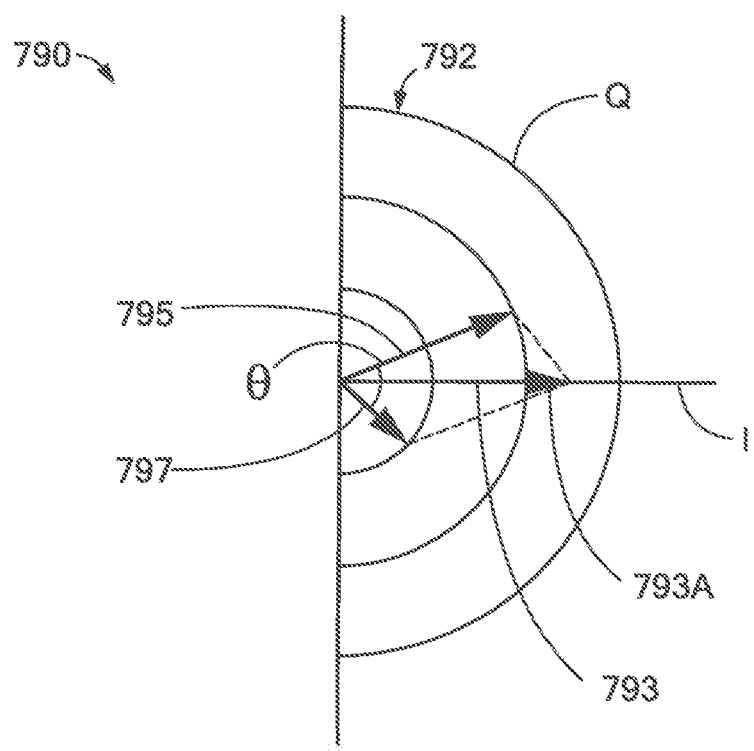
FIG. 7B is polar coordinate graphical representation of coordinates (I, Q) of a baseband signal.

Referring now to FIG. 7B, an exemplary operation of an asymmetric multilevel outphasing (AMO) modulation technique to determine control voltages and phase components will now be described. A graph 790 is a polar representation in coordinates (I, Q) of a baseband signal. Half circles (an example of which is designated by reference numeral 792) correspond to discrete amplitude values. The graph 790 includes a complex vector 793 at a phase-amplitude baseband constellation point 793A.

The AMO modulation technique decomposes the complex vector 793 into a first vector 795 and a second vector 797. The first and second vectors 795, 797 are a baseband representation of outputs of power amplifiers, as may be similar to power amplifiers 720A and 720B of the RF circuit embodiment 701 described in conjunction with FIG. 7A. An outphasing angle θ is defined between the first and second vectors 795, 797.

Mathematically, AMO modulation technique can be defined with the polar representation of the baseband signal, according to the following equation:

$$C(t) = r_i(t) + jr_q(t) = A(t)e^{j\theta(t)} \quad (1)$$

Here, C represents a baseband signal over time t, and $r_i$ and $r_j$ are respective real and imaginary coordinates of baseband signal C. In equation (1), A represents amplitude and θ represents the angle.

C(t) can be linearized by predistorting power amplifier output using a polar lookup table (as may be similar to polar lookup table 762 described in conjunction with FIG. 7A) using the following equation:

$$P(t) = A_p(t)e^{j\theta_p(t)} \quad (2)$$

Here, $\theta_p$ is the lookup table value. In an RF circuit including a first and a second power amplifier (as may be similar to RF circuit 701 described in conjunction with FIG. 7A), P(t) can be decomposed into two parts using the following equation:

$$P(t) = W(V_1(t)e^{j\phi 1(t)}, V_2(t)e^{j\phi 2(t)}) \quad (3A)$$

Here, $V_1$ represents a first voltage level output at time t from the first power amplifier and proportional to the input power supply voltage into the first power amplifier and $V_2$ represents a second voltage level output at time t from the second power amplifier and proportional to the input power supply voltage into the second power amplifier. W represents Wilkinson power combining. In this way, voltage levels (i.e., first voltage level and second voltage level) can be dynamically selected over time and/or at various times during operation of the AMO circuit. Advantageously, the AMO circuit is able to adjust to dynamic power-efficiency needs of an application.

A first phase component $\phi_1$ representing a first phase input to the first power amplifier and a second phase component $\phi_2$ representing a second phase input to a second power amplifier can be calculated as follows:

$$\Phi_1(t) = \theta_p(t) + \cos^{-1}\frac{(V_1(t)^2 + 2A_p(t)^2 - V_2(t)^2)}{2\sqrt{2}\,V_1(t)A_p(t)}, \quad (3B)$$

$$\Phi_2(t) = \theta_p(t) - \cos^{-1}\frac{(V_2(t)^2 + 2A_p(t)^2 - V_1(t)^2)}{2\sqrt{2}\,V_2(t)A_p(t)}$$

The AMO modulation technique can be used to optimize efficiency of an RF circuit (as may be similar to RF circuit embodiment 100 described in conjunction with FIG. 1) by minimizing power loss in a power combiner (as may be similar to RF power combiner 140 described in conjunction with FIG. 1). An optimal value of each level $r_k$ can be determined, in which levels $r_k$ are the maximum output amplitudes A for each supply voltage levels when a power supply drives power amplifiers (as may be similar to power supply 110 and power amplifiers 120A and 120B described in conjunction with FIG. 1). The Wilkinson combiner efficiency at a given output amplitude A driven by two power amplifiers with different supply voltages can be represented according to the following equation:

$$\eta_c(A, r_k, r_j) = \frac{A^2}{r_k^2 + r_j^2} \quad (4)$$

Equation (4) simplifies to a standard Wilkinson efficiency when $r_k = r_j$. The total average efficiency can be computed if the amplitude power distribution function (PDF) p(A) of the signal is known. For example, total average efficiency can be computed by dividing the PDF into several regions separated by the $r_k$ (and $r_k$ combinations), integrating the PDF curve to find the efficiency in each region, and summing the result. For N different supply voltages, there will be $$\binom{N}{2}$$

combination of supply voltages given two power amplifiers. However, the power combiner efficiency decreases as the difference between two voltage levels increases. Also, the efficiency improvement may be relatively small when the difference between the two voltages is relatively large. Therefore, the supply voltage combinations can be restricted to adjacent voltage supply levels (i.e., $r_k$ and $r_{k+1}$). Using this restriction together with the known PDF of the transmitted signal, the optimum combination of supply voltages can be determined by exhaustive search.

Although AMO modulation has been described using Wilkinson power combining, one of ordinary skill in the art will readily appreciate that other power combining techniques may be used. Furthermore, although AMO modulation has been described with reference to two power amplifiers, such is not intended as limiting and one of ordinary skill in the art will readily appreciate that more than two power amplifiers may be used.

Figure 8:
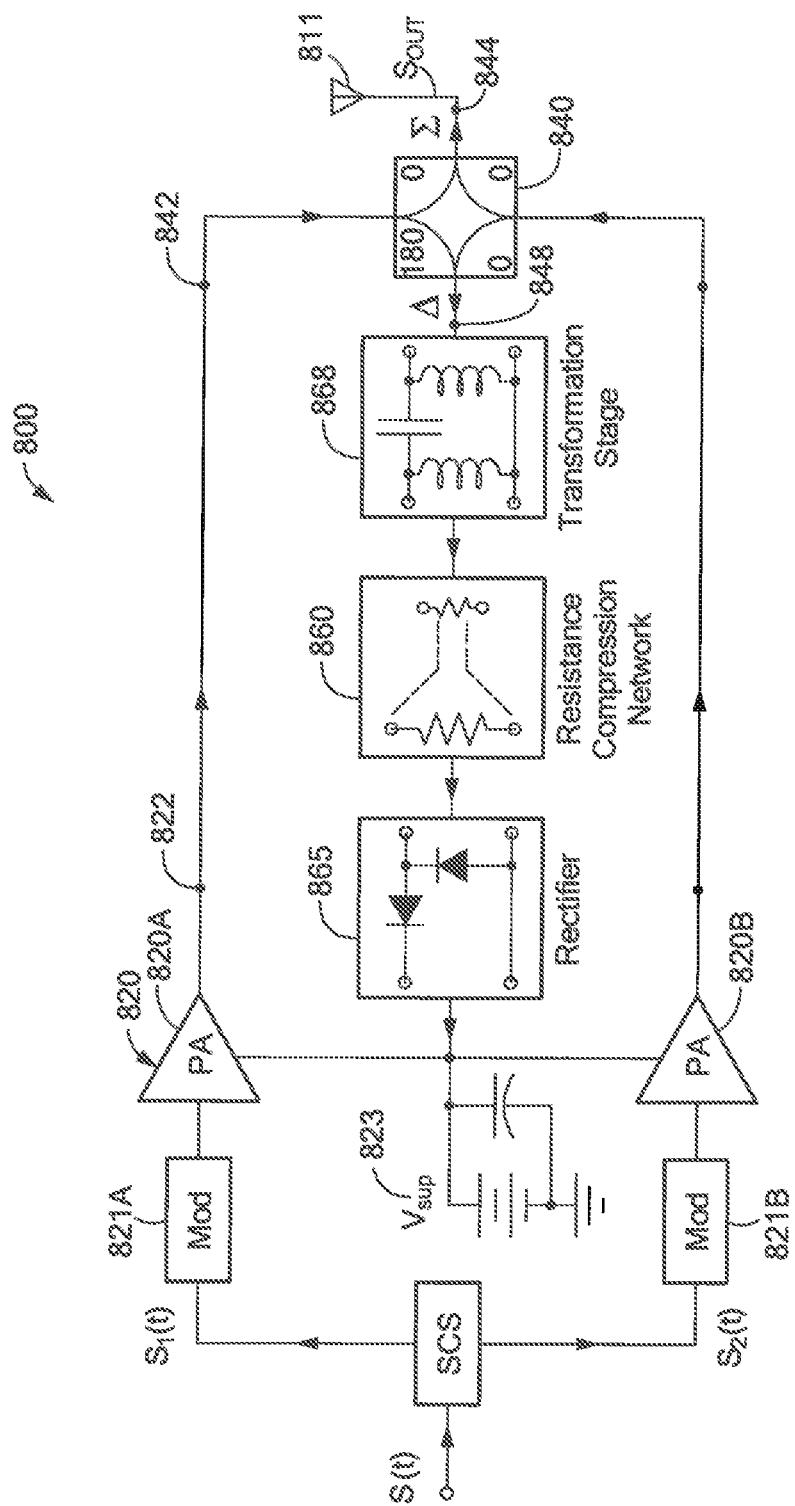
FIG. 8 is a block diagram of an embodiment of an outphasing energy recovery amplifier.

Referring now to FIG. 8, in another aspect an RF circuit 800 includes a plurality of power amplifiers 820, each having an RF output port 822 and an RF power combiner circuit 840 having a plurality of input ports 842 coupled to respective ones of the RF output ports 822 of the plurality of power amplifiers 820. The RF power combiner 840 includes a resistance compression network (RCN) 860, a rectification circuit 865 coupled to the resistance compression network 860, and an output port 844 at which is provided an output signal $S_{out}$ of the RF circuit 800. The RF circuit output port 844, in some embodiments, is coupled to a load 811, such as an antenna.

In a further embodiment, an impedance transformation stage 868 is coupled to an isolation port 848 of the power combiner 840 and the RCN 860. The impedance transformation stage 868 matches a RCN impedance to an impedance required by the power combiner 840.

The RF circuit embodiment 800 of FIG. 8 includes a first power amplifier 820A and a second power amplifier 820B. In some embodiments, the first power amplifier 820A receives a first signal $S_1(t)$ output from modulator 821A and the second power amplifier 820B which receives a second signal $S_2(t)$ output from modulator 821B. In the same or different embodiment, a source signal S(t) may be fed through a sinusoidal signal source (SCS) to provide signals $S_1(t)$ and $S_2(t)$. A voltage supply 823 provides power to each of the power amplifiers 820A, 820B and recovers power from RF power combiner 840 as will be described herein below.

An exemplary operation of the RF circuit embodiment 800 will now be described. Because the power combiner 840 requires a fixed resistance at the isolation port 848 to ensure matching and isolation between the first and second outphased power amplifiers 820A, 820B, the RF-dc converter which recovers the wasted power should provide a constant resistive impedance at its input. A purely resistive input impedance can be achieved with a variety of rectifier structures, a non-limiting example of which includes an ideal half bridge rectifier driven by a sinusoidal current source of amplitude $I_{in}$ and frequency $\omega_s$, and having a constant output voltage $V_{dc}$. A voltage at the input terminals of the rectifier $V_x(t)$ will be a square wave having a fundamental component of amplitude $V_{x1}=(2V_{dc}/\pi)$ in phase with an input current $i_{in}(t)$. The electrical behavior at the fundamental frequency $\omega_s$ (neglecting harmonics) can be modeled as a resistor of value $R_{eq}=(2/\pi)(V_{dc}/I_{in})$. One of ordinary skill in the art will readily appreciate that there are many other types of rectifier topologies that can achieve the above-mentioned behavior.

Driving a rectifier (such as the above-described ideal half bridge rectifier) with a tuned network suppresses the harmonic content inherent in rectifier operation and results in a resistive impedance characteristic at a desired frequency. This equivalent resistance can be represented by the following equation:

$$R_{rect} = k_{rect} \frac{V_{dc}}{|I_1|} \qquad (5)$$

where $k_{rect}$ depends on the specific rectifier structure and $|I_1|$ is the fundamental component of the drive current. Ignoring harmonics, the power delivered to the rectifier is $P_{in}=\frac{1}{2}I_{in}^2 R_{rect}$. The rectifier impedance can be written as follows:

$$R_{rect} = \frac{(k_{rect}V_{dc})^2}{2P_{in}} \qquad (6)$$

Equation (6) shows that the rectifier input impedance is inversely proportional to input power. The equivalent input impedance of the rectifier varies with input power which can reduce the isolation between the power amplifiers and can lower power amplification efficiency (and in some instances, cause complete malfunction) and increase unwanted signal distortion at the output.

To mitigate these unwanted effects, an RCN 860 is included to reduce the rectifier impedance variation. The RCN 860 can be combined with an appropriate set of rectifiers 865 to yield an RF-dc converter with narrow-range resistive input characteristics.

Although operation of the outphasing energy recovery amplifier 800 of FIG. 8 has been described with reference to two power amplifiers 820A, 820B, such is not intended as limiting and one of ordinary skill in the art will readily appreciate that more than two power amplifiers may be used, and that one may choose to use additional resistance compression networks 860 and rectifiers 865 to recover additional energy that would otherwise be dissipated in the power combining process. Moreover, although operation of the outphasing energy recovery amplifier 800 of FIG. 8 has been shown with energy recovery directly to a power supply applied to the two amplifiers 820A, 820B, one of ordinary skill in the art will readily appreciate that energy may be recovered to any other storage location that may be convenient, and that power supplies for the power amplifiers 820 could be derived elsewhere (e.g., for AMO modulation).

Figure 9:
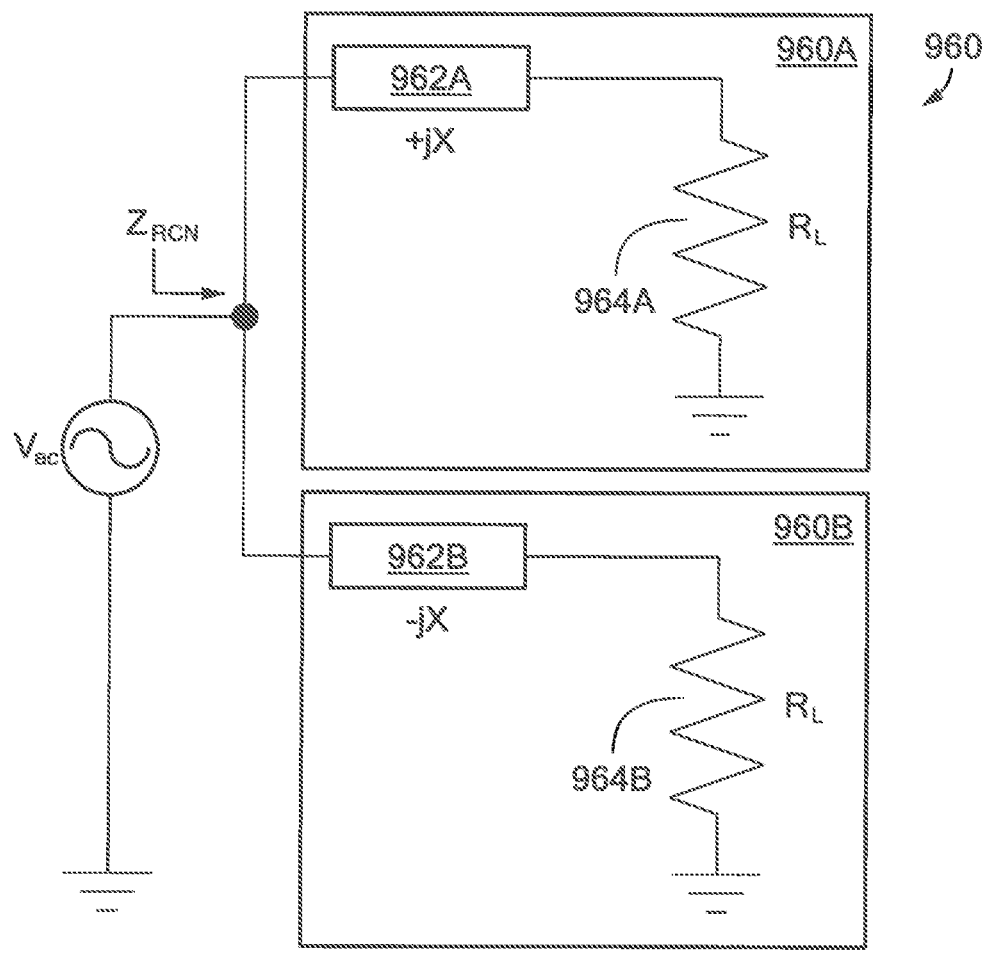
FIG. 9 is a block diagram of an embodiment of a resistance compression network embodiment used in the amplifier embodiment of FIG. 8.

Referring now to FIG. 9, in some embodiments an RCN 960 includes a first RCN element 960A and a second RCN element 960B, characterized by a resistive input characteristic that varies little as the input power changes. The first RCN element 960A includes a first conjugate reactance 962A in series with a first matched load resistance 964A and the second RCN element 960B includes a second conjugate reactance 962B in series with a second matched load resistance 9648. First and second RCN elements 960A, 960B represent an equivalent resistance of two rectifiers as given by equation (6). The reactive branches are designed to have the specified reactance X at the designed operating frequency. It can be shown that at this frequency the input impedance of the RCN 960 will be resistive with a value $R_{RCN}$ indicated as follows:

$$R_{RCN} = \frac{X^2}{2R_{rect}}\left[1 + \left(\frac{R_{rect}}{X}\right)^2\right] \qquad (7)$$

In this way, compression of matched load resistances $R_{rect}$ is provided about a center value of impedance X. For variations of $R_{rect}$ over a range having a geometric mean of X (i.e., $R_{rect} \in [X/c_{rect}^{1/2}), c_{rect}^{1/2}X]$, where $c_{rect}$ is the ratio of the largest to smallest resistances in the $R_{rect}$ range), the corresponding ratio of the compressed $R_{RCN}$ range can be shown to be as follows:

$$c_{RCN} = \frac{1+c_{rect}}{2\sqrt{c_{rect}}} \quad (8)$$

For example, a 10:1 variation in $R_{rect}$ ($c_{rect}$=10) results in a modest 1.74:1 variation in $R_{RCN}$. Since $R_{rect}$ is inversely proportional to $P_{in}$ as shown in equation (6), this means a 10:1 variation in power delivered to the isolation port would result in only a 1.74:1 variation in isolation port resistance. This narrowed range of resistance will result in substantially improved isolation between the outphased power amplifiers (as may be similar to outphased power amplifiers 820A, 820B described in conjunction with FIG. 8), greatly improving amplification efficiency.

It should be noted that at sufficiently high output power levels (i.e., low power levels to the rectifiers), the rectifier resistance can no longer be effectively compressed. This is because at low input power levels, the diodes will be unable to turn "on" and overcome the combination of supply voltage and diode built-in potential. When the diodes turn "off", equations (5) and (6) are no longer valid and the efficiency of the RCN drops considerably. However, this poses no serious problems. In this region of operation, most of the power from the power amplifiers is delivered to the load, and so the isolation port acts as a virtual open circuit. Therefore, the rectifier impedance and the efficiency of the RCN do not matter.

Figure 10:
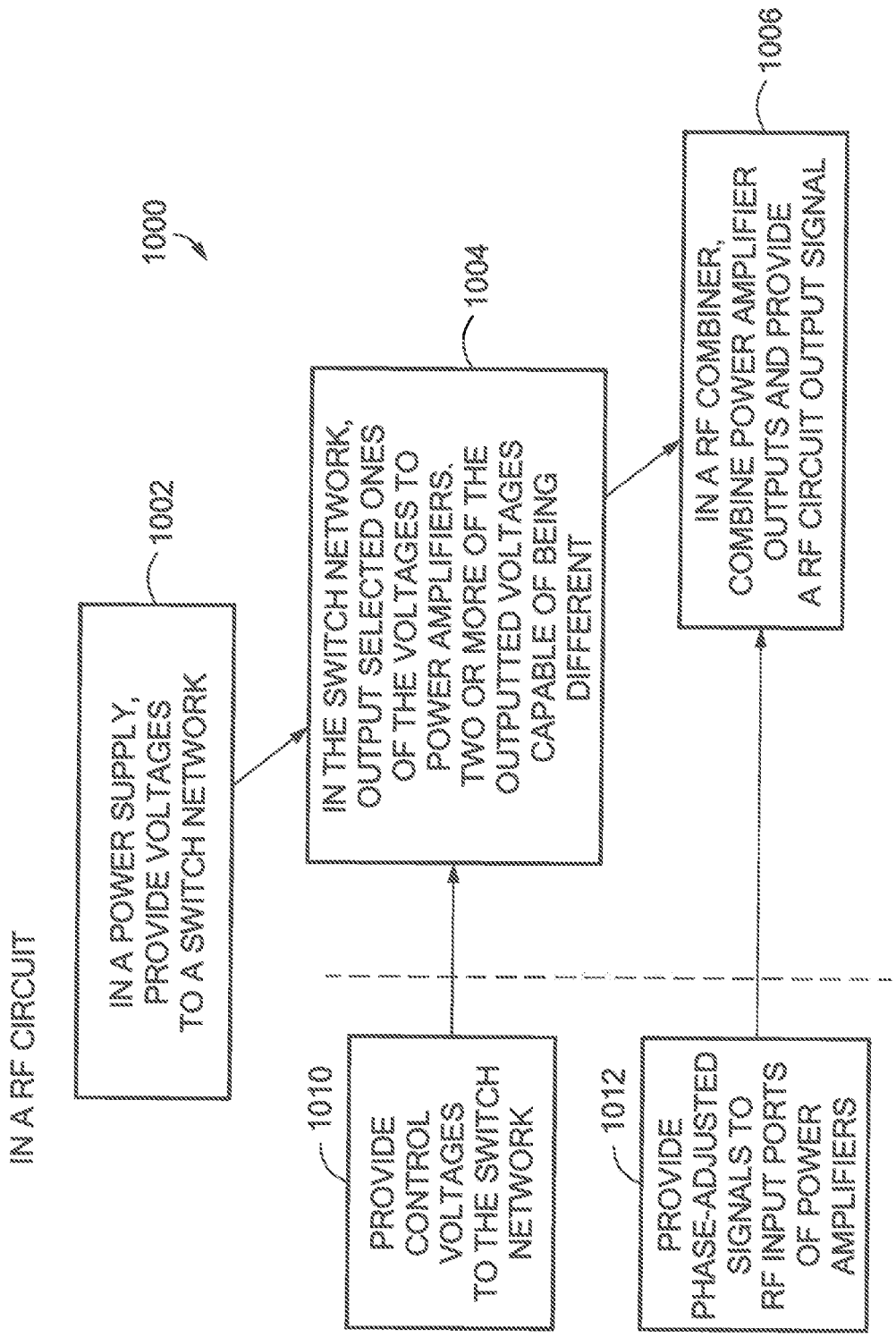
FIG. 10 is a flow diagram of an asymmetric multilevel outphasing transmission method.

Referring now to FIG. 10, an RF transmission method 1000 includes, in a power supply, providing voltages to a switch network 1002, in the switch network, outputting selected ones of the voltages to power amplifiers, two or more of the outputted voltages capable of being different 1004, and, in an RF combiner, combining power amplifier outputs and providing an RF circuit output signal 1006. In a further embodiment, the method 1000 includes providing control voltages to the switch network 1010 and providing phase-adjusted signals to RF input ports of the power amplifiers 1012.

In a further embodiment, the method 1000 includes decreasing a difference between a sum of the powers outputted by the power amplifiers and an RF power outputted at the output port of the RF circuit. In still a further embodiment, the method 1000 includes minimizing the difference between the sum of the powers outputted by the power amplifiers and the RF power outputted at the output port of the RF circuit.

In a further embodiment, the method 1000 includes gating on a variable number of transistors in at least one of the power amplifiers.

In a further embodiment, the method 1000 includes, in the RF combiner circuit, providing isolation between the plurality of input ports.

In a further embodiment, the method 1000 includes processing at least a portion of the RF power output from the power amplifiers using at least one resistance compression network and at least one rectification circuit coupled to the at least one resistance compression network, wherein the processed RF power includes recovered RF power from the RF power combiner circuit.

Having described embodiments of the concepts, circuits, and techniques described herein, it will now become apparent to one of ordinary skill in the art that other embodiments incorporating these concepts, circuits, and techniques may be used. It is felt therefore that these embodiments should not be limited to disclosed embodiments, but rather should be limited only by the spirit and scope of the appended claims.

What is claimed is:

1. A radio-frequency circuit comprising:
a plurality of power amplifiers each having an input port, an output port and a power supply port;
a power combiner having a plurality of input ports and an output port, said power combiner input ports coupled to the output ports of said power amplifiers;
a means for providing a plurality of voltages; and
a means for selectively coupling ones of the plurality of voltages to the power supply ports of said power amplifiers, wherein the voltages provided to at least two of the power supply ports may be independently selected from among the plurality of voltages.

2. The radio-frequency circuit of claim 1, wherein said means for selectively coupling ones of the plurality of voltages to the power supply ports of said power amplifiers comprises a switching network.

3. The radio-frequency circuit of claim 2, wherein said means for selectively coupling ones of the plurality of voltages to the power supply ports of said power amplifiers further comprises one or more low pass filters coupled between the switching network and the power supply ports of the plurality of power amplifiers.

4. The radio-frequency circuit of claim 3, wherein said low-pass filters suppress undesired high-frequency content from being introduced at the output of said combiner.

5. The radio-frequency circuit of claim 2, wherein circuit parasitic inductance and capacitance provide filtering to suppress undesired high-frequency content from being introduced at the output of said combiner.

6. The radio-frequency circuit of claim 1, wherein said means for providing a plurality of voltages comprises a power supply configured to provide a plurality of voltages from a voltage supply.

7. The radio-frequency circuit of claim 6, wherein said power supply is a switched-capacitor power supply.

8. The radio-frequency circuit of claim 6, wherein said power supply comprises:
a power control circuit that produces a variable voltage; and
a switched-capacitor circuit coupled to the variable voltage which produces said plurality of voltages.

9. The radio-frequency circuit of claim 1, further comprising:
a control circuit configured to receive digital signals I and Q, and to produce phase-modulated RF signals to the respective ones of the power amplifier input ports.

10. The radio-frequency circuit of claim 9, wherein said control circuit is further configured to produce signals to control said means for selectively coupling ones of the plurality of voltages to the power supply ports of said power amplifiers.

11. The RF circuit of claim 1, wherein:
said voltage providing means comprises a power supply to generate the plurality of voltages; and
said means for coupling selected ones of the plurality of voltages corresponds to a switch network.

12. The RF circuit of claim 1, wherein each of the power amplifiers has an RF input port and further comprises means for controlling an output signal of the RF circuit by adjusting phases of the signals received at the RF input ports and dynamically selecting the ones of the plurality of voltages outputted to each of the power amplifiers.

13. The RF circuit of claim 1 further comprising means for decreasing a difference between a sum of the powers outputted by the plurality of RF amplifiers and an RF power outputted at the output port of the RF circuit.

14. The RF circuit of claim 1, wherein said means for combining comprises means for isolating each of the plurality of input ports.

15. The RF circuit of claim 1, wherein said means for combining comprises:
   at least one resistance compression network; and
   at least one rectification circuit coupled to the at least one resistance compression network.

16. A radio-frequency (RF) circuit having an input port for receiving an RF signal and having an output port at which an RF signal is provided, the RF circuit for coupling a plurality of voltages to a load and the RF circuit comprising:
   a plurality of RF amplifiers each having an input port coupled to the input of the RF circuit an output port and a bias terminal;
   a power combiner having a plurality of input ports and an output port with each of the plurality of power combiner input ports coupled to the output port of a corresponding one of said plurality of RF amplifiers and with the power combiner output port coupled to the output port of the RF circuit; and
   a switch network for selectively coupling ones of the plurality of voltages to the bias terminals of said RF amplifiers, wherein the voltages provided to at least two of the bias terminals are independently selected from among the plurality of voltages.

17. The radio-frequency circuit of claim 16, wherein:
   said RF amplifiers are provided as RF power amplifiers; and
   the bias terminals of said RF power amplifiers correspond to one or more power supply ports of said power amplifiers.

18. The radio-frequency circuit of claim 17, wherein said switch network for selectively coupling ones of the plurality of voltages to the power supply ports of said power amplifiers further comprises one or more filters having a low pass frequency characteristic coupled between said switching network and the power supply ports of said plurality of power amplifiers.

19. The radio-frequency circuit of claim 18, wherein said low-pass filters are provided having filter characteristics selected to suppress undesired high-frequency content from being introduced at the output of said power combiner.

20. The radio-frequency circuit of claim 17, wherein the radio-frequency circuit is provided having a circuit parasitic inductance and having a circuit parasitic capacitance which provides filtering to suppress undesired high-frequency content from being introduced at the output of said power combiner.

21. The radio-frequency circuit of claim 16, further comprising:
   a control circuit configured to receive digital signals I and Q, and to produce phase-modulated RF signals to the respective ones of the power amplifier input ports.

22. The radio-frequency circuit of claim 21, wherein said control circuit is further configured to produce signals to control said means for selectively coupling ones of the plurality of voltages to the power supply ports of said power amplifiers.

23. The RF circuit of claim 16, wherein the switch network is configured to output selected ones of the plurality of voltages from the plurality of switch network output ports, at least two of the switch network output port voltages capable of being different ones of the plurality of voltages.

24. The RF circuit of claim 16 further comprising an RF combiner circuit having a plurality of input ports coupled to RF output ports of the plurality of RF amplifiers and an output port at which is provided an output signal of the RF circuit.

25. The RF circuit of claim 18, wherein the power combiner circuit further comprises:
   a resistance compression network; and
   a rectification circuit coupled to the resistance compression network.

26. The RF circuit of claim 16 further comprising a control system configured to provide the phase-adjusted signals over a plurality of first output ports coupled to the RF input ports of the plurality of RF amplifiers and the plurality of control signals over a plurality of second output ports coupled to the switch network.

27. The RF circuit of claim 20, wherein the control system is further configured to decrease a difference between a total of the power output from the plurality of power amplifiers and a power output from the RF circuit.

28. A radio-frequency (RF) circuit comprising:
   a plurality of RF power amplifiers each having an input port, an output port and a power supply port;
   a power combiner having a plurality of input ports and an output port, said power combiner input ports coupled to the output ports of said power amplifiers;
   a switched-capacitor power supply for providing a plurality of voltages; and
   a switch network for selectively coupling ones of the plurality of voltages between said switched-capacitor power supply and the power supply ports of said RF amplifiers, wherein the voltages provided to at least two of the power supply ports may be independently selected from among the plurality of voltages.

29. The radio-frequency circuit of claim 28, wherein said switched-capacitor power supply comprises:
   a power control circuit that produces a variable voltage; and
   a switched-capacitor circuit coupled to the variable voltage which produces said plurality of voltages.

30. The radio-frequency circuit of claim 29, further comprising:
   a control circuit configured to receive digital signals I and Q, and to produce phase-modulated RF signals to the respective ones of the power amplifier input ports.

31. The radio-frequency circuit of claim 28, wherein said control circuit is coupled to said switch network and configured to produce signals to control said switch network for selectively coupling ones of the plurality of voltages to the power supply ports of said power amplifiers.

32. A radio frequency (RF) circuit comprising:
   a plurality of RF amplifiers, each of the plurality of RF amplifiers having an RF output and a supply voltage input;
   supply voltage means for providing a plurality of amplifier supply voltages;
   means for coupling selected ones of the plurality of amplifier supply voltages provided by said supply voltage means to respective ones of the supply voltage inputs of the plurality of RF amplifiers, at least two of the amplifier supply voltages capable of being different ones of the plurality of amplifier supply voltages provided by said supply voltage means; and
   means for combining, having a plurality of input ports with each of the plurality of input ports coupled to a respective one of the RF output ports of said plurality of RF amplifiers, said means for combining capable of receiving RF signals from each of the plurality of RF amplifiers and combining the RF signals provided thereto to provide an RF output signal at an output thereof.

33. A radio frequency (RF) circuit comprising:

a power supply capable of generating a plurality of voltages;

a switch network having a plurality of input ports coupled to the power supply and a plurality of switch network output ports;

a plurality of RF amplifiers, each having an RF output port and a supply input port coupled to a corresponding one of the plurality of switch network output ports, wherein each of the RF amplifiers has an RF input port configured to receive a phase adjusted signal and the switch network is configured to receive at least one control signal, wherein the phase adjusted signals and the at least one switching circuit control signal are used to control the output signal of the RF circuit.

* * * * *

UNITED STATES PATENT AND TRADEMARK OFFICE
CERTIFICATE OF CORRECTION

| | | |
|---|---|---|
| PATENT NO. | : 8,957,727 B2 | Page 1 of 1 |
| APPLICATION NO. | : 13/798738 | |
| DATED | : February 17, 2015 | |
| INVENTOR(S) | : Joel Dawson et al. | |

It is certified that error appears in the above-identified patent and that said Letters Patent is hereby corrected as shown below:

Title page, item (56) FOREIGN PATENT DOCUMENTS, delete "EP 170 366 A2" and replace with --EP 1 750 366 A2--

Title page, item (56) FOREIGN PATENT DOCUMENTS, delete "EP 170 366 A3" and replace with --EP 1 750 366 A3--

Signed and Sealed this
Twenty-fourth Day of May, 2016

Michelle K. Lee
*Director of the United States Patent and Trademark Office*